United States Patent
Briffa et al.

[19]

[11] Patent Number: 6,075,411
[45] Date of Patent: Jun. 13, 2000

[54] METHOD AND APPARATUS FOR WIDEBAND PREDISTORTION LINEARIZATION

[75] Inventors: Mark Anthony Briffa, Lötsjövägen; Pär Seth Thure Bergsten, Wibomsvägen, both of Sweden

[73] Assignee: Telefonaktiebolaget LM Ericsson, Stockholm, Sweden

[21] Appl. No.: 08/995,663

[22] Filed: Dec. 22, 1997

[51] Int. Cl.[7] ........................................ H03F 1/26
[52] U.S. Cl. ................................... 330/149; 375/297
[58] Field of Search ............................... 330/149, 136; 375/297

[56] References Cited

U.S. PATENT DOCUMENTS

| | | | |
|---|---|---|---|
| 4,465,980 | 8/1984 | Huang et al. | 330/149 |
| 4,554,514 | 11/1985 | Whartenby et al. | 330/149 |
| 4,885,551 | 12/1989 | Myer | 330/151 |
| 5,107,520 | 4/1992 | Karam et al. | 375/60 |
| 5,148,448 | 9/1992 | Karam et al. | 455/126 |
| 5,486,789 | 1/1996 | Palandech et al. | 330/149 |
| 5,650,758 | 7/1997 | Xu et al. | 330/149 |
| 5,748,678 | 5/1998 | Valentine et al. | 375/297 |
| 5,760,646 | 6/1998 | Belcher et al. | 330/149 |
| 5,862,460 | 1/1999 | Rich | 455/126 |
| 5,929,703 | 7/1999 | Schier et al. | 330/149 |

FOREIGN PATENT DOCUMENTS

| | | |
|---|---|---|
| WO92/20146 | 11/1992 | WIPO . |
| WO97/37427 | 10/1997 | WIPO . |

OTHER PUBLICATIONS

Stapleton S.P., et al: "Simulation and Analysis of an Adaptive Predistorter Utilizing a Cimplex Spectral Convolution", IEEE Transactions on Vehicular Technology, vol. No. 4, pp. 387–394, Nov. 1994.

*Primary Examiner*—Robert Pascal
*Assistant Examiner*—Khanh Van Nguyen
*Attorney, Agent, or Firm*—Burns, Doane, Swecker & Mathis, L.L.P.

[57] ABSTRACT

A predistortion signal is generated which compensates for third order and higher order intermodulation distortion over a wideband. The predistortion signal is applied to an input radio frequency signal, for example a multi-tone radio frequency signal. The predistortion signal is a low order polynomial having adjustable coefficients. The predistortion signal can compensate for intermodulation products produced a nonlinear amplifier, and the polynomial coefficients can be adjusted based on the difference between the amplifier output and the input radio frequency signal.

20 Claims, 6 Drawing Sheets

METHOD AND APPARATUS FOR WIDEBAND PREDISTORTION LINEARIZATION

TECHNICAL FIELD OF THE INVENTION

This invention relates to a method and apparatus for compensating for distortion. More particularly, this invention relates to a method and apparatus for wideband predistortion linearization.

DESCRIPTION OF RELATED ART

Radio frequency (RF) signals often contain envelope variations due, for example, to amplitude modulations or the combination of two or more RF carriers or RF tones. Inter-Modulation Distortion (IMD) results if these amplitude modulated or multi-tone RF signals are, for example, amplified by nonlinear amplifiers. IMD causes undesired interference to be generated at frequencies other than the tone frequencies of the multi-tone RF signal. This interference typically occurs at frequencies close to the tone frequencies and is thus difficult to filter out. Some form of linearization is therefore desirable in order to suppress IMD caused by nonlinear amplification.

In amplifier design, there is a trade off between distortion performance and efficiency. Linear amplifiers which operate under "Class A" conditions create little distortion but are inefficient, whereas nonlinear amplifiers operated under "Class C" conditions are reasonably efficient but introduce significant distortions. While both efficiency and distortion are important considerations in amplifier design, efficiency becomes increasingly important at high power levels. Because of their efficiency, nonlinear amplifiers are largely preferred, leaving the problem of distortion to deal with.

There are a number of known amplifier linearization techniques for reducing the distortion caused by nonlinear amplification. Conventional amplifier linearization techniques can be broadly categorized as Feedback, Feedforward, or Predistortion.

Feedback is a well known linearization technique which has been extensively applied. For example, U.S. Pat. No. 2,102,671 to Black discloses an early negative feedback linearization technique for reducing distortion at audio frequencies. H. A. Rosen and A. T. Owens, "Power Amplifier Linearity Studies for SSB Transmissions", IEEE Transactions on Communication Systems, pp. 150–159, June 1964 discloses a feedback linearization technique for reducing distortion at radio frequencies. A more recent feedback technique is Cartesian Feedback which uses negative feedback of a baseband quadrature modulation. An example of this type of feedback is disclosed in M. A. Briffa and M. Faulkner, "Stability Analysis of Cartesian Feedback Linearization for Amplifiers with Weak Nonlinearities", IEE Proceedings on Communications, Vol. 143, No. 4, pp. 212–218, August 1996. Other modern feedback linearization techniques include Polar Feedback, which is discussed in U.S. Pat. No. 5,023,937 to Opas, and Intermediate Frequency (IF) Feedback, which is disclosed in K. G. Voyce and J. H. McCandless, "Power Amplifier Linearization Using IF Feedback", IEEE MTT-S Digest, pp. 863–866, 1989.

A problem with these feedback linearization techniques is that system delays typically limit the available linearization bandwidth. Feedback techniques are thus usually restricted to narrowband systems, e.g., single carrier linear modulation schemes. Another disadvantage with these feedback linearization techniques is that they are potentially unstable.

Feedforward is another well known linearization technique which has been successfully applied at radio frequencies. A typical feedforward RF power amplifier is disclosed in U.S. Pat. No. 5,157,346 to Powell et al. According to this technique, the amplified output is compared with the input signal in a first comparison loop to yield an error signal. The error signal is amplified and reintroduced to the output, 180° out of phase with the original distortion in the output, in a second correction loop, thereby canceling the distortion in the final output. This technique provides excellent IMD suppression over a wide linearization bandwidth.

A drawback of the feedforward linearization technique is that it typically requires the use of an error amplifier which needs to be linear and is hence generally operated in Class A. This reduces the efficiency of the feedforward technique, although a feedforward amplifier is still more efficient than a Class A amplifier with comparable performance.

Another well known linearization technique is predistortion. According to this technique, linearization is achieved by distorting an input signal according to a predistortion function in a manner that is complementary to the amplifier distortion such that the overall transfer from predistorter input to amplifier output is a linear function.

The predistortion technique can be applied either at actual RF frequencies or at baseband, i.e., before modulation with an RF carrier. When applied at RF frequencies, the predistortion technique exhibits wideband linearization performance. However, because the predistortion function becomes more complicated and thus more difficult to implement for higher order distortion, the predistortion technique typically only reduces IMD products up to the third order. T. Nojima and T. Konno, "Cuber Predistortion Linearizer for Relay Equipment in 800 MHz Band Land Mobile Telephone Systems", IEEE Transactions on Vehicular Technology, Vol. VT-34, No. 4, pp. 169–177, November 1985 and U.S. Pat. No. 4,943,783 to Nojima disclose a typical cubic predistorter which reduces IMD products up to the third order.

Figure 1A:
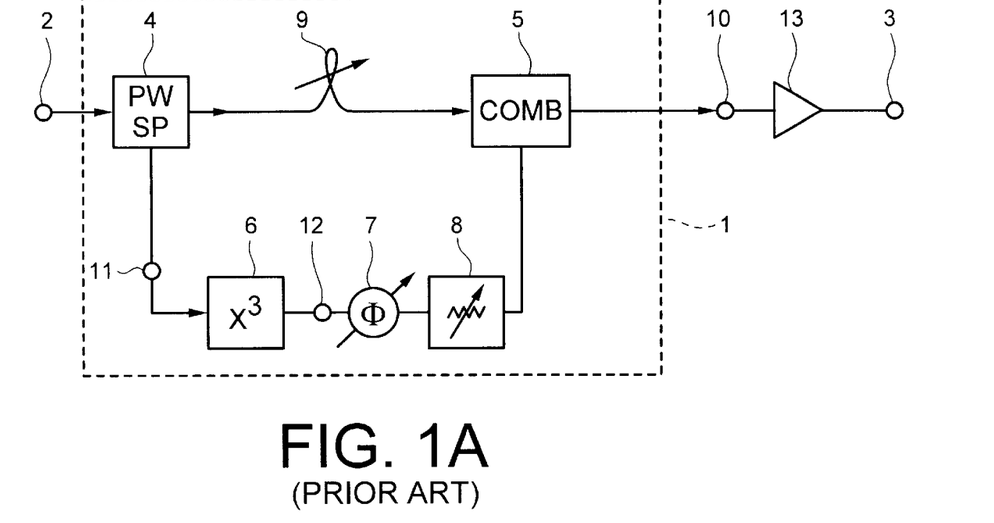
FIG. 1A is a block diagram of a conventional third order predistorter.

FIG. 1A illustrates a conventional cubic predistorter 1 such as that disclosed in Nojima and Konno. An input RF signal received at an input terminal 2 is split by a power splitter 4 into two signals of substantially the same amplitude. One of the split signals is applied to a linear signal path which contains a variable delay line 9. The other split signal is applied to a nonlinear signal path which contains a third order function generator 6, a variable phase adjuster 7, and a variable attenuator 8. The third order function generator 6 generates a third order predistortion signal based on the received input RF signal and outputs the predistortion signal at terminal 12. The variable phase adjuster 7 adjusts the phase of the predistortion signal, and the variable attenuator 8 adjusts the amplitude of the predistortion signal. The amplitude and phase adjusted predistortion signal is combined with the linear signal supplied from the delay line 9 in a combiner 5. The combined signal is delivered at terminal 10 to the RF power amplifier (PA) 13. In this manner, third order IMD products caused by the RF PA 13 are eliminated in the amplified signal, thus linearizing the RF PA 13. Wideband linearization can be achieved if the delay line 9 compensates for the delay incurred in producing the predistortion signal.

Figure 1B:
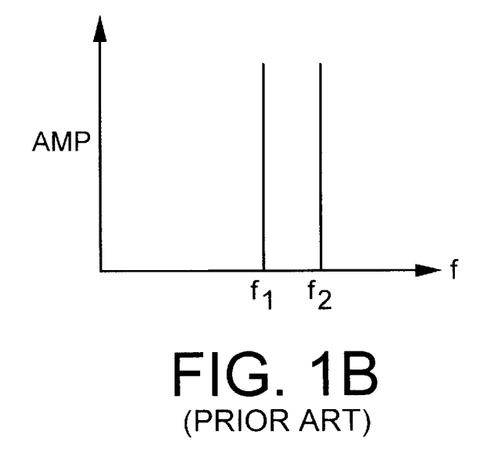
FIG. 1B illustrates a spectrum of a two-tone input RF signal applied to the predistorter shown in FIG. 1A.
Figure 1C:
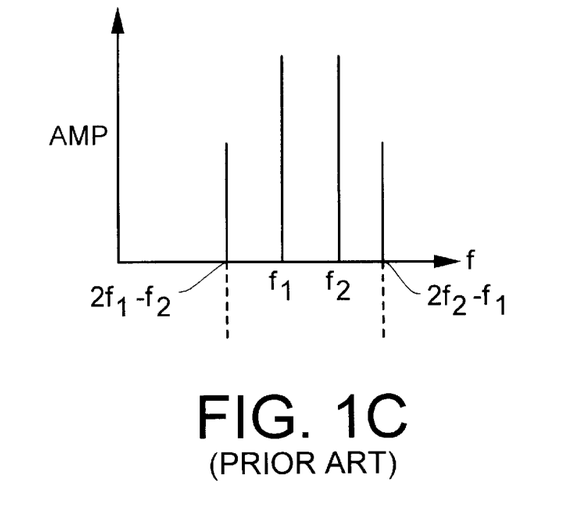
FIG. 1C illustrates a spectrum of an RF PA amplified output of the third order predistorter shown in FIG. 1A.

FIG. 1B shows a spectrum of an RF signal comprising two tones at $f_1$, and $f_2$ that may be applied to the predistortion circuit 1. FIG. 1C illustrates an output spectrum of the RF PA 13. As shown in FIG. 1C, the output spectrum includes the fundamental components at $f_1$, and $f_2$ and third order IMD distortion components at $2f_1-f_2$ and $2f_2-f_1$ produced by the RF PA 13 as indicated by the solid lines. The output spectrum also includes third order predistortion components at frequencies $2f_1-f_2$ and $2f_2-f_1$ injected by the predistortion circuit 1 as indicated by the broken lines. As can be seen in FIG. 1C, the injected third order predistortion components are of equal amplitude but opposite phase to the third order IMD products of the RF PA 13. Thus, the third order predistortion components cancel out the third order IMD products.

A problem with this approach is that RF power amplifiers seldom generate only third order IMD products but also generate higher order IMD products. Typically, these higher order IMD distortion products are not accounted for and actually rise when the third order IMD products are suppressed.

Figure 2:
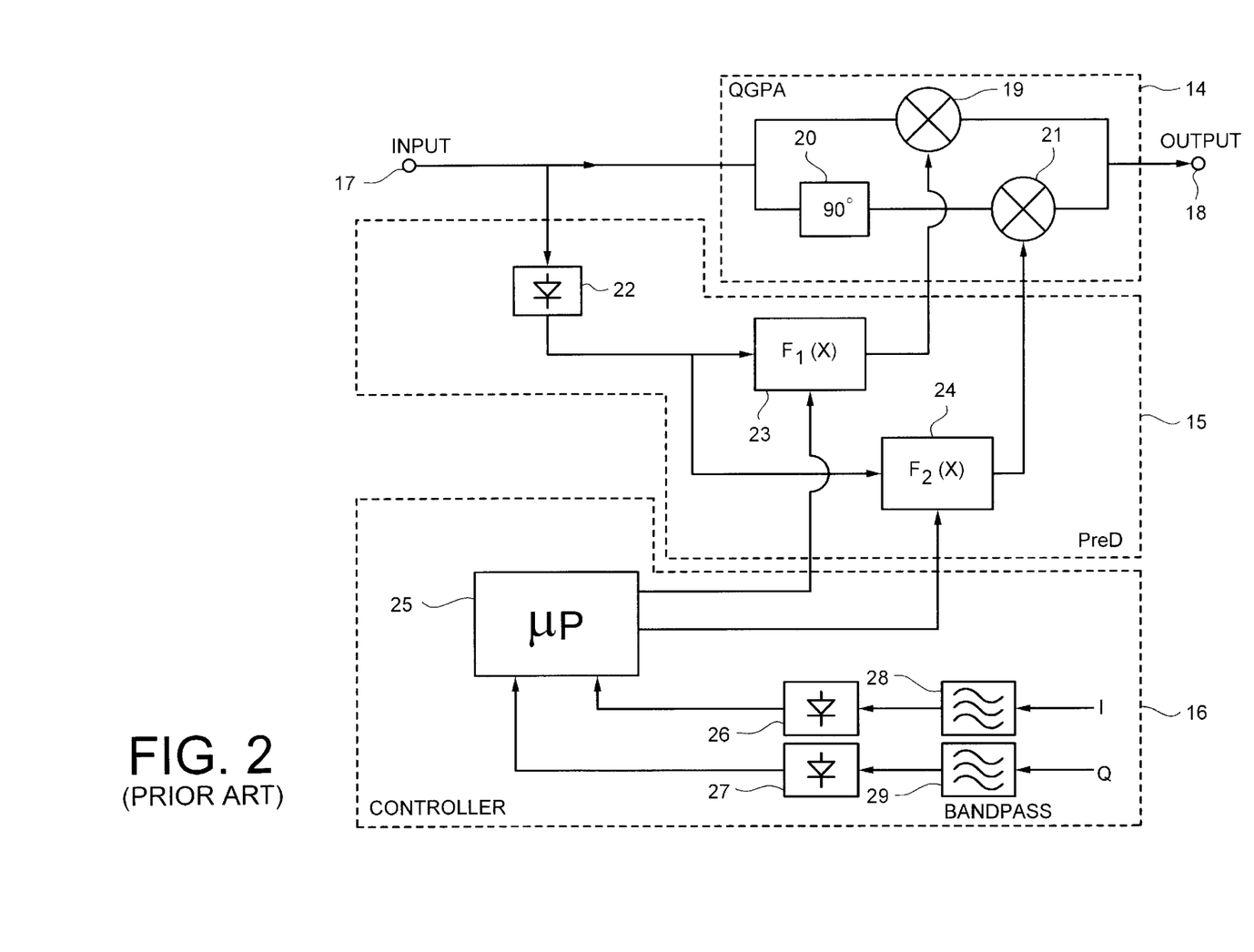
FIG. 2 is a block diagram of a conventional fifth order predistorter.

In an attempt to solve this problem, S. P. Stapleton and J. K. Cavers, "A New Technique for the Adaptation of Linearizing Predistorters", Proceedings of the IEEE Vehicular Technology Conference, pp. 753–758, May 1991 discloses a predistorter for compensating for third and higher order IMD products. FIG. 2 shows this improved predistorter, which essentially comprises three main blocks: a Quadrature Gain Phase Adjuster (QGPA) 14, a baseband polynomial Predistortion circuit (PreD) 15, and a Controller 16.

As shown in FIG. 2, an input RF signal is applied to both the QGPA 14 and the PreD 15 at an input terminal 17. The PreD 15 circuit detects the envelope of the input RF signal with a detector 22 and generates two predistortion signals by processing the detected envelope through nonlinear function generators $F_1(x)$ 23 and $F_2(x)$ 24. The function generators $F_1(x)$ 23 and $F_2(x)$ 24 generate in-phase and quadrature (I & Q) signals which are multiplied with the incoming signal in the QGPA 14 to form third order and fifth order predistortion components. The complex multiplication process combined with the use of a detected envelope enables both Amplitude Modulation to Amplitude Modulation (AM/AM) and Amplitude Modulation to Phase Modulation (AM/PM) distortion to be corrected for but resolved in Cartesian form.

The complex multiplication is achieved in the QGPA 14 circuit by first splitting the input RF signal into two paths, one which is input into the multiplier 19 and one which is input into the multiplier 21. The signal is the same on both paths except that the signal input into the multiplier 21 is shifted in phase by 90° by a phase shifter 20 in relation to the signal input into the multiplier 19.

The coefficients of the two polynomial functions generated in the function generators $F_1(x)$ 23 and $F_2(x)$ 24 are provided by a microprocessor ($\mu$p) 25 in the Controller 16. The microprocessor 25 makes adjustments to the coefficients based on the magnitude of in-phase and quadrature feedback signals derived from the output of the RF PA being linearized (not shown). The I & Q feedback signals are bandpass filtered in filters 28 and 29 in order to measure the IMD by separating it from the actual desired signal. This is only possible if the desired signal being amplified is a single carrier signal for which the IMD products are known to lie in bands on either side of the single carrier modulation. The detectors 26 and 27 determine the magnitude of the bandpass filtered IMD so that the microprocessor 25 can adjust the coefficients of the predistortion functions to minimize this distortion and thus minimize the level of IMD products present in the output of the RF PA.

While this technique compensates for third and higher order IMD products, it is only suitable for single carrier applications. In multi-carrier systems, the positions of the carriers, and hence the resulting IMD, cannot always be obtained with the bandpass filtering approach. This makes this technique unsuitable for wideband applications which typically involve multi-tone input signals, the wideband nature of these applications resulting from a combination of individual narrow band RF signals spaced across some given band plan (spectrum).

Digital Signal Processing (DSP) can be applied for more elaborate predistortion. For example, U.S. Pat. No. 5,049, 832 to Cavers discloses an adaptive linearization technique employing DSP. A problem with employing DSP is that the linearization bandwidth is significantly constrained by the DSP sampling frequency and the required digital/analog converters. Thus, systems using DSP are typically not suitable for wideband applications.

None of these conventional techniques compensates for high order IMD in a wideband application with multi-tone RF input signals. In addition, none of these conventional techniques distinguish between peak and average level signals.

When tones are combined in a multi-tone system, constructive interference can make the peak of the multi-tone RF signal significantly large compared to its average level. For a nonlinear multi-tone power amplifier to be economical and reasonably power efficient, it cannot be dimensioned to accommodate the peaks of such a signal. Consequently, some of the peaks in the multi-tone signal will be clipped when the amplifier saturation limit is exceeded.

In conventional predistorters, such as those illustrated in FIGS. 1A and 2, no attempt is made to discriminate between operation below or above the saturation limit of the RF PA. As a consequence, predistortion is applied to RF input signals which would normally cause the RF PA to saturate. Once the RF PA has saturated, application of the predistortion signal has no effect on the amplitude of the output, since a large complementary input to the RF PA will not raise its output amplitude above its saturated RF output limit. The situation for the phase, however, is drastically different. Predistortion corrections applied to the phase of the RF input signal are transferred to the output. With conventional predistorters, these phase corrections are grossly incorrect with respect to peak input signals and hence cause a significant degradation in predistortion performance at such peaks.

There is thus a need for a wideband predistortion technique for multi-tone RF signals which compensates for high order IMD products. There is also a need for a predistortion technique which is effective for peak RF input signals.

SUMMARY

It is therefore an object of the invention to provide a technique for compensating for high order IMD products. It is a further object of the present invention to prevent the degradation of the IMD compensation for peak input signals while simultaneously providing a significant improvement in IMD compensation for average input signals.

According to an exemplary embodiment of the present invention, a predistortion signal is generated which compensates for third order and higher order IMD products over a wideband, and the predistortion signal is applied an input RF signal, for example a multi-tone RF signal. The predistortion function is a low order polynomial having adjustable coefficients. The predistortion function is generated based on a detected envelope of the input RF signal, thus making the predistortion virtually independent of the tone frequency. The detected envelope is clipped to approximately a hyperbolic tan shape and is scaled. The clipping shape approximates that of a hyperbolic tan (tanh) function, preventing the detected envelope from exceeding a certain value and thus preventing grossly inaccurate predistortion compensation when large peaks are present in the detected envelope.

According to an exemplary embodiment, the predistortion signal compensates for IMD products produced by a non-linear amplifier. The coefficients of the polynomial are adjusted based on a difference between the amplifier output and the input RF signal.

BRIEF DESCRIPTION OF THE DRAWINGS

Exemplary embodiments of the invention will now be described in more detail with reference to the accompanying drawings, in which like descriptive labels are used to refer to similar elements and in which.

DETAILED DESCRIPTION

In this description, specific details such as particular circuits, circuit components, techniques, etc., are set forth for purposes of explanation and not limitation in order to provide a thorough understanding of the invention. It will be apparent to one of ordinary skill in the art that the invention may be practiced in other embodiments that depart from these specific details. Details of well known methods, devices, and circuits are omitted so as not to obscure the description of the invention.

According to the present invention, third and higher order IMD products are compensated for by applying a predistortion signal to an input RF signal. According to an exemplary embodiment of the invention, a predistortion signal is generated with analog processing components which allow wideband operation.

Figure 3:
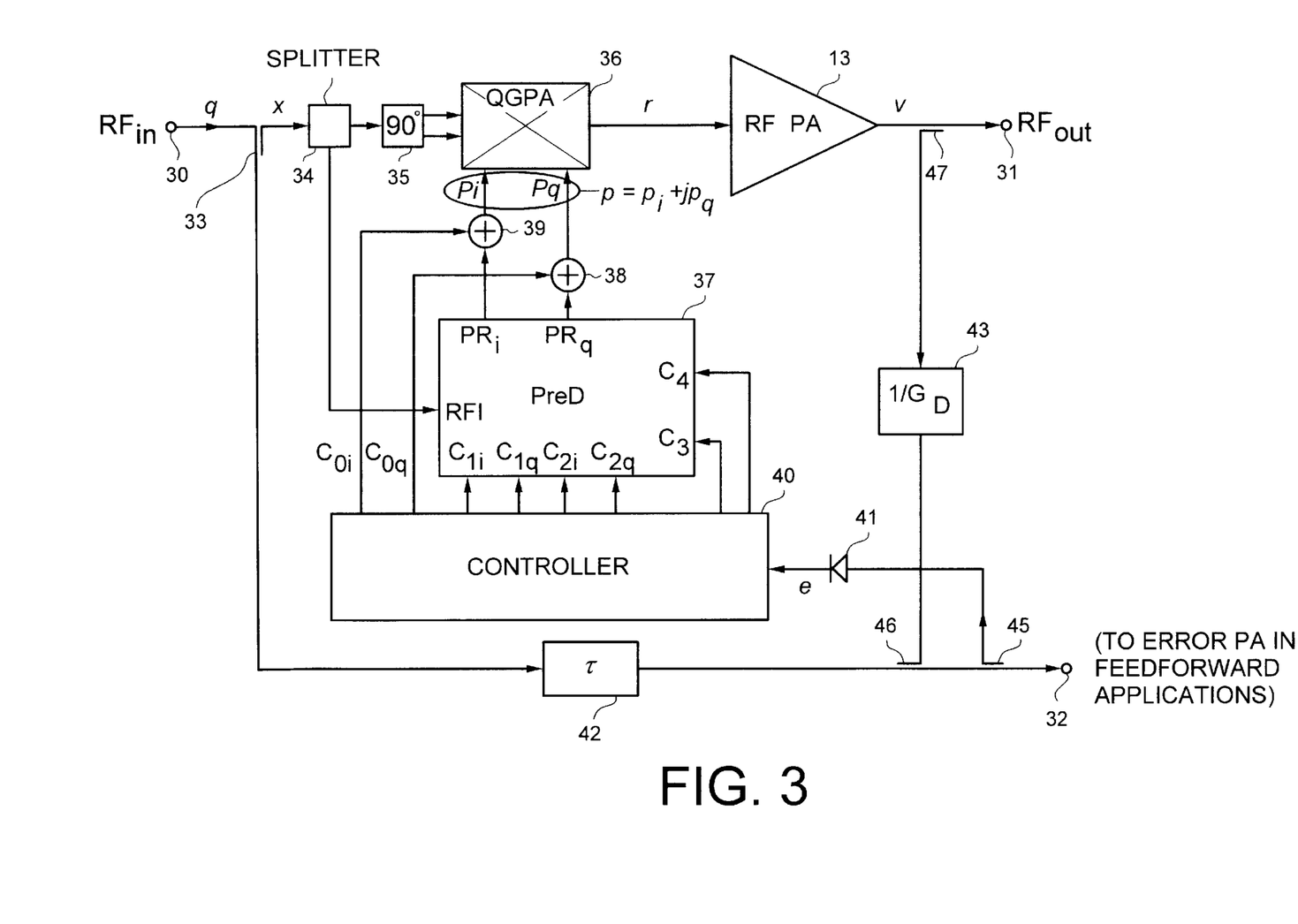
FIG. 3 is a block diagram of an analog predistortion system according to an exemplary embodiment of the invention.

FIG. 3 illustrates an exemplary predistortion system 100 according to an embodiment of the invention. The system includes a Predistortion circuit (PreD) 37 which generates an analog predistortion signal and a Quadrature Gain Phase Adjuster (QGPA) 36 which applies the predistortion signal to a multi-tone RF input of an RF PA 13.

The PreD 37 internally generates an appropriate predistortion signal based on the multi-tone RF input signal $RF_{in}$ received at the terminal 30. The received input signal q from the terminal 30 is split into two branches of equal amplitude by an input coupler 33. (The bold indicates a complex signal, the time dependency of which has been suppressed for clarity.) One branch is fed to a delay element 42. The other branch is fed as a signal x to a Splitter 34. The Splitter 34 splits the signal x into two more branches of equal amplitude, one which supplies the PreD 37, and one which is fed to a 90° Splitter 35. The 90° Phase Splitter splits the signal x into two branches and multiplies one branch by 0° and the other branch by 90°, thus resulting in a complex signal.

The PreD 37 generates a predistortion signal p based on the signal x. The 90° Splitter 35 enables the QGPA 36 to multiply the complex predistortion signal p from the PreD 37 with the signal x and thereby adjust the magnitude and phase of the signal x. The adjusted signal is output from the QGPA 36 as a signal r to the RF PA 13.

The operation of the predistortion system in gain-based form can be described mathematically as:

$$r = xp \tag{1}$$

where r is the predistorted RF signal, x is the RF input, and p is the predistortion signal (or dynamic complex gain signal) generated by the PreD 37, i.e., $p = p_i + jp_q$. The predistortion signal p can be generated by the PreD 37 in Cartesian form as follows:

$$p_i = |x|^2 C_{2i} + |x| C_{1i} + C_{0i} \tag{2a}$$

$$p_q = |x|^2 C_{2q} + |x| C_{1q} + C_{0q} \tag{2b}$$

where $|x|$ is the magnitude of the signal x and $C_{2i}$, $C_{2q}$, $C_{1i}$, $C_{1q}$, $C_{0i}$, and $C_{0q}$ represent the coefficients of the predistortion signal which can be adjusted by the Controller 40. The QGPA 36 can be implemented with, for example, two multipliers and a summer to multiply the terms of the predistortion signal p by the incoming signal x.

Equation 1 can be rewritten in an expanded complex form as:

$$r = x(|x|^2 C_2 + |x| C_1 + C_0) \tag{3}$$

where $$C_0 = C_{0i} + jC_{0q} \tag{4a}$$

$$C_1 = C_{1i} + jC_{1q} \tag{4b}$$

$$C_2 = C_{2i} + jC_{2q} \tag{4c}$$

Referring again to FIG. 3, the Controller 40 adjusts the predistortion signal coefficients by minimizing the difference between the input q and a scaled output of the RF PA 13. The output v of the RF PA 13 is coupled via a coupler 47 to an Attenuator 43. The coupled output is scaled in an Attenuator 43, and the scaled output is coupled via a coupler 46 to the input signal, the input signal having been delayed by the element 42 by an amount substantially equal to the delay in the predistortion branch. The Attenuator 43 scales the output v from the coupler 47 by an amount $1/G_D$, where $G_D$ corresponds to the gain of the RF PA 13, the gain of the coupler 47, etc., so that the gain of the scaled output signal matches the gain of the delayed input signal. The scaled output signal and the delayed input signal are coupled via a coupler 45 to a Detector 41 which detects the difference in the scaled output signal and the delayed input signal and reports this difference as an error signal e to the Controller 40. The Controller 40 adjusts the predistortion signal coefficients $C_{1i}$, $C_{1q}$, $C_{2i}$, and $C_{2q}$ to minimize the error signal e. This accounts for changes in amplifier characteristics that occur with temperature and time variations. The Controller 40 also generates the constant complex coefficients $C_{0i}$ and $C_{0q}$ which are added to the PreD output by the Summers 38 and 39 to correct the static portion of the difference between the RF amplifier input and output. The Controller 40 can be implemented with, for example, a microprocessor.

As can be seen from the gain based predistortion signal of Equation 3, without the PreD 37, i.e., with $C_{1i}=0$, $C_{1q}=0$, $C_{2i}=0$, $C_{2q}=0 \Rightarrow C_1=0$, $C_2=0$, the gain of the QGPA 36 is governed by the setting of the complex coefficient, $C_0 = C_{0i} + C_{0q}$. Thus, without the PreD 37, the QGPA 36 can only adjust the complex gain of the RF PA 13 independently of the applied RF input level. Since the RF PA 13 has a complex gain which varies somewhat as the RF input level is varied i.e., it is nonlinear, such a fixed adjustment will result in zero input-output difference at only one RF level. At other levels, the input-output difference will be non-zero. Introducing the PreD 37 enables the complex gain to be varied dynamically as a function of the RF input level and hence enables the reduction of the input-output difference over a range of RF levels, thus effectively linearizing the RF PA 13. Allowing the $C_1$ term in enables the PreD 37 to adjust the complex gain of the QGPA 36 in a way proportional to the magnitude of the input. Allowing the $C_2$ term in allows the complex gain to be varied in response to the square of the input magnitude.

Figure 4:
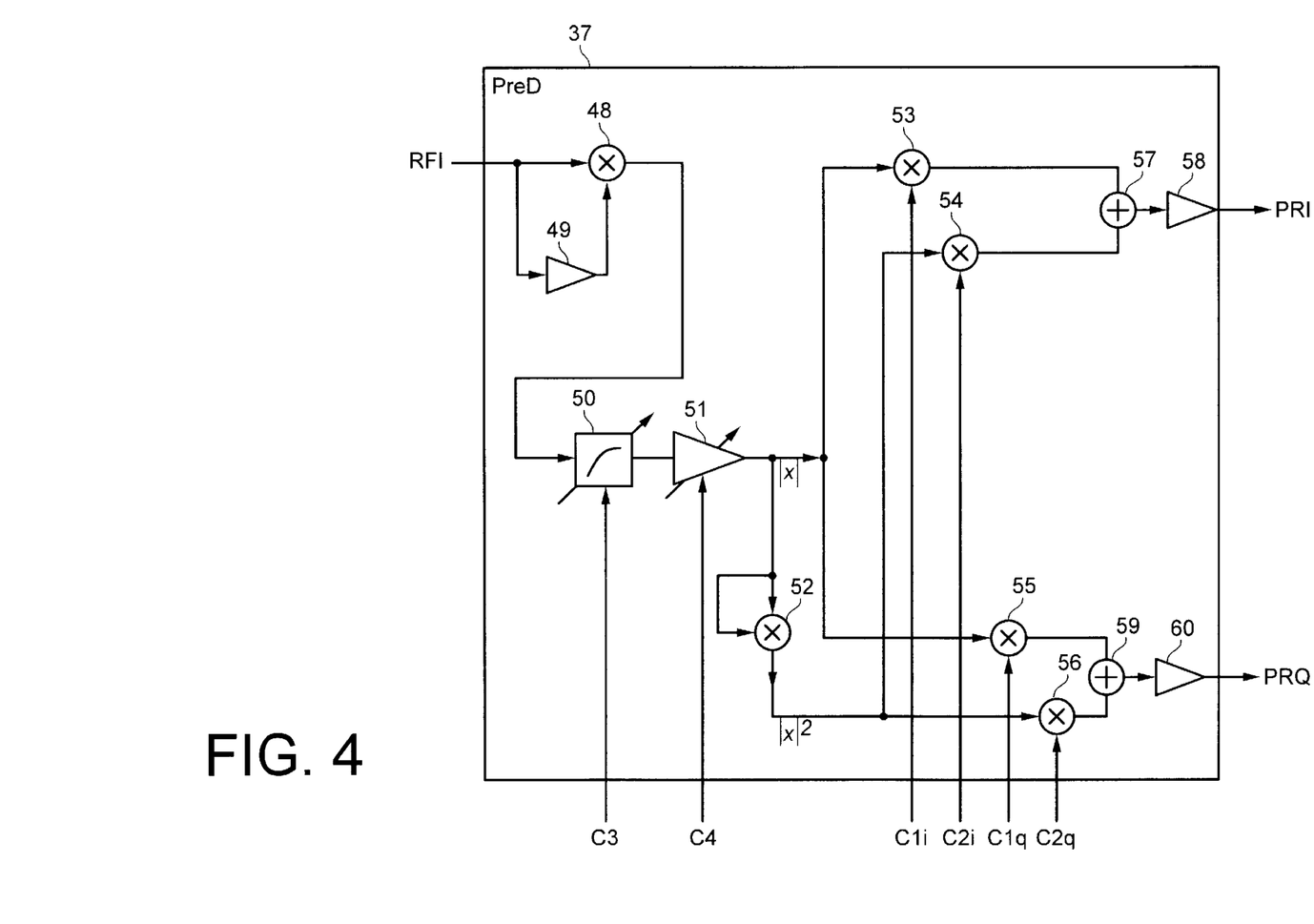
FIG. 4 is a detailed block diagram of an exemplary predistortion circuit according to an embodiment of the present invention.

FIG. 4 illustrates a detailed block diagram of an exemplary predistortion circuit. According to an exemplary embodiment, the predistortion circuit of FIG. 4 corresponds to the PreD 37 of FIG. 3. It should be understood, however, that the invention is not so limited, and the predistortion circuit according to the present invention can be implemented in any system for which third and higher order IMD compensation is desirable.

Referring to FIG. 4, the input RF signal RFi (which, according to an exemplary embodiment, corresponds to the signal x in FIG. 3) is applied to an input detector comprising a Mixer 48 and a Limiting Amplifier 49. The input detector detects the envelope of the input RF signal. This makes the predistortion virtually independent of the tone frequency. The detected envelope is applied to a Variable Saturation Amplifier (VSA) 50. The VSA 50 effectively enables clipping of the detected envelope with a clip level that can be controlled externally via a control voltage applied at terminal C3. According to an exemplary embodiment, the clipping shape approximates that of a hyperbolic tan (tanh) function which prevents the envelope from exceeding a certain value. This prevents the PreD 37 from making grossly inaccurate pre-corrections when large peaks are present in the detected envelope.

The clipped signal from the VSA 50 is applied to a Variable Gain Amplifier (VGA) 51. The VGA 51 scales the clipped signal and enables the entire PreD 37 circuit to be switched off or progressively disabled in response to a control voltage applied at terminal C4.

The scaled output of the VGA 51 represents the preprocessed envelope of the RF input. This signal, $|x|$, is squared in a Squarer 52 to yield $|x|$hu 2. In order to generate the functions given by Equations 2a and 2b, both $|x|$ and $|x|^2$ are applied to four linear output multiplier circuits 53, 54, 55, and 56. These multipliers multiply $|x|$ and $|x|^2$ by $C_{1i}$, $C_{2i}$, $C_{1q}$ and $C_{2q}$, respectively. The multiplied signals are added by Summers 57 and 59 and buffered in Buffers 58 and 60 to yield the two outputs PRI and PRQ, respectively. These outputs represent the higher order terms of Equations 2a and 2b, i.e. PRI=$|x|^2 C_{2i} + |x| C_{1i}$ and PRQ=$|x|^2 C_{2q} + |x| C_{1q}$. The lower order terms ($C_{0i}$ and $C_{0q}$) of Equations 2a and 2b are subsequently added to PRI and PRQ by Summers 38 and 39 to give $p_i$ and $p_q$, respectively.

Although described above in gain-based form, the predistortion system can also be described by an input to output transfer function by expanding Equation 3 as follows:

$$r = x|x|^2 C_2 + x|x| C_1 + x C_0 \qquad (5)$$

Figure 5A:
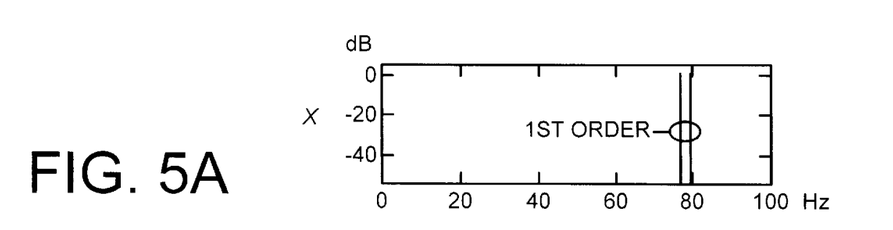
FIG. 5A–5C illustrate the behavior of terms of an exemplary predistorted RF signal in the frequency domain according to an embodiment of the present invention.
Figure 5B:
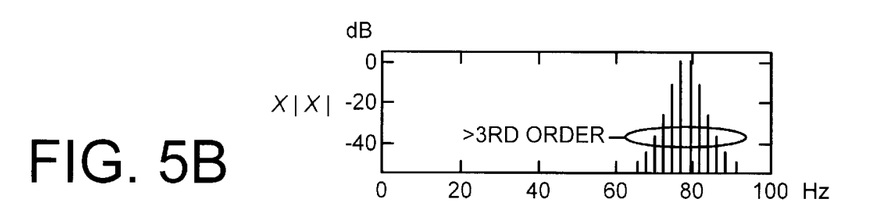
Figure 5C:
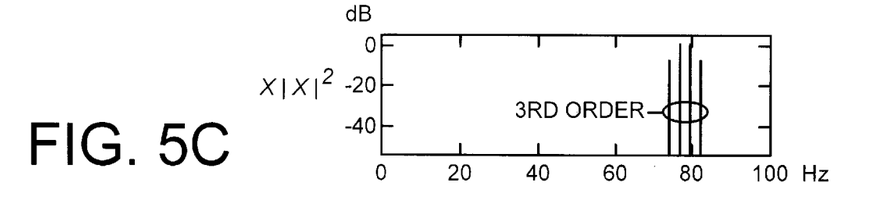

Equation 5 shows that the predistorted signal r contains a first order term $x C_0$ for compensating for first order IMD, a third order term $x|x|^2 C_2$ for compensating for third order IMD, and an additional term $x|x| C_1$ which compensates for many IMD products well beyond the third order IMD products, thus affording effective linearization performance for high order IMD products. This can be better understood with reference to FIGS. 5A–5C which illustrate the behavior of the terms of the predistorted signal r, excluding the coefficients, in the frequency domain. As can be seen from FIGS. 5A and 5C, the first order term x provides for first order predistortion, and the term $x|x|^2$ provides substantially third order predistortion. FIG. 5B shows, however, that the term $x|x|$ provides for predistortion well beyond the third order.

Figure 6A:
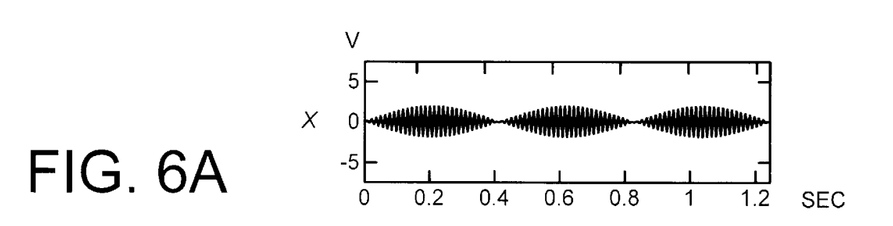
FIG. 6A–6C illustrate the behavior of terms of an exemplary predistorted RF signal in the time domain according to an embodiment of the present invention.
Figure 6B:
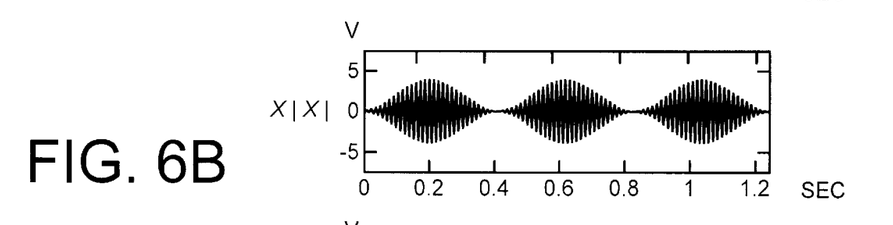
Figure 6C:
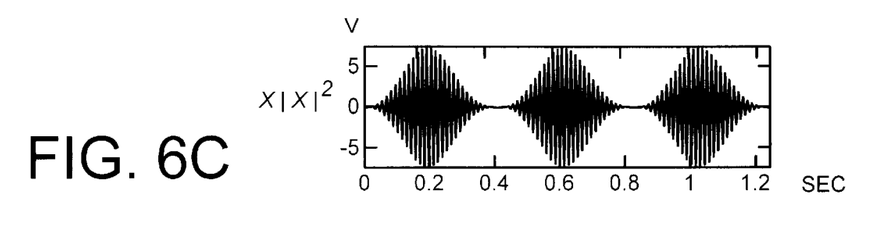

In addition to providing predistortion for higher order IMD products, the $x|x|$ term is well behaved with regard to dynamic range. As can be seen from FIGS. 6A–6C, which illustrate the behavior of the predistorted signal terms in the time domain, the amplitude of these terms changes more rapidly, i.e., rises and falls faster, with every order of $|x|$. Similarly, comparing $x|x|$ with alternative high order terms, e.g., $x^5$, $x^7$, etc., when the amplitude of x is relatively large (>1), the amplitudes of the alternative high order terms rise faster than the amplitude of the $x|x|$ term, and will thus reach clip limits earlier in an electronic embodiment. When x is relatively small (<1), the amplitudes of the alternative high order terms fall faster than the amplitude of the $x|x|$ term and will thus approach the noise floor much faster in an electronic embodiment. The $x|x|$ term thus simplifies the electronic implementation of the predistortion circuit, especially when dealing with multi-tone signals which inherently have a high dynamic range.

Figure 7A:
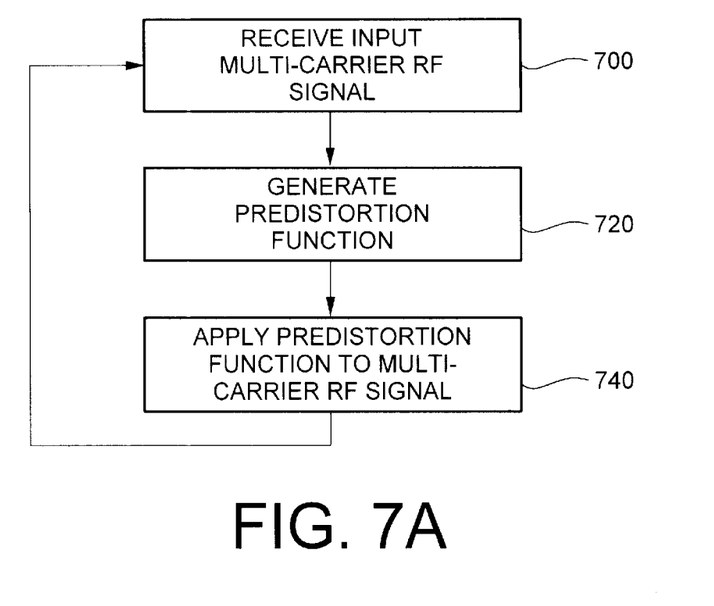
FIG. 7A illustrates an exemplary method for compensating for distortion according to an embodiment of the present invention.

FIG. 7A illustrates an exemplary method for compensating for distortion according to an embodiment of the present invention. The method begins at step 700 at which an input multi-tone RF signal is received. At step 720, the predistortion signal is generated. At step 740, the predistortion signal is applied to the input multi-tone RF signal. After the predistortion signal is applied, the input multi-tone RF signal is, for example, amplified, and the IMD produced by the amplifier is compensated for by the predistortion signal. As shown in FIG. 7A, the predistortion method is repeated for as long as the input RF signal is received.

Figure 7B:
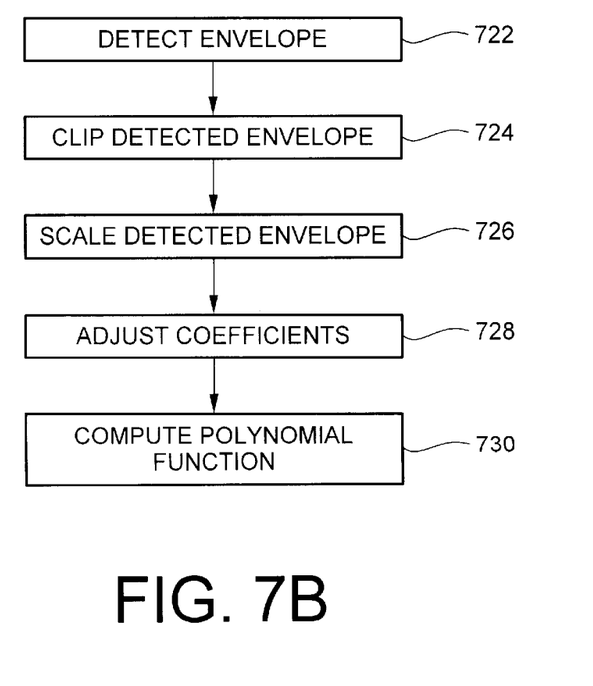
FIG. 7B illustrates an exemplary method for generating a predistortion signal according to an embodiment of the present invention.

FIG. 7B illustrates an exemplary method for generating a predistortion signal according to an embodiment of the present invention. The method begins at step 722 at which the envelope of the input multi-tone RF signal is detected. The detected envelope is clipped at step 724 and scaled at step 726. Next, at step 728, coefficients are adjusted by the Controller 40, based, for example, on a detected error between the input of the amplifier and the output of the amplifier. Finally, at step 730, the polynomial predistortion signal is computed by multiplying the coefficients adjusted by the Controller 40 with the detected envelope.

According to the invention, average IMD performance can be improved over a widebandwidth while reducing incorrect predistortion at peak input levels. In experimental tests with a center frequency of 1500 MHz and an average output power of 25 Watts (W), an improvement of more than 10 decibels (dB) average IMD was realized without destroying peak IMD performance over at least 10 MHz of bandwidth. The predistortion technique according to the present invention can be applied at nearly any carrier frequency with very little modification.

It will be understood that the invention is not limited to the particular embodiments that are described and illustrated above. For example, although the embodiments above are described with reference to compensating for distortion caused by a non-linear amplifier, the invention can be applicable to compensate for IMD from any source. In addition, although the input RF signal has been described above as a multi-tone RF signal, it should be appreciated that the invention is also applicable to single tone RF input signals. The specification contemplates any and all modifications that fall within the scope of the invention as defined by the following claims.

What is claimed is:

1. An apparatus for compensating for distortion over a wideband, the apparatus comprising:

means for receiving an input wideband radio frequency signal;

predistortion circuitry which includes means for generating a wideband predistortion signal which is a low order polynomial and which compensates for third order and higher order intermodulation distortion products; and a circuit for applying the wideband predistortion signal to the input wideband radio frequency signal.

2. The apparatus of claim 1, wherein said circuit for applying the wideband predistortion signal comprises:

means for applying the wideband predistortion signal to a multi-tone radio frequency signal.

3. The apparatus of claim 1, wherein the circuit for applying the predistortion signal comprises a quadrature gain phase adjuster.

4. The apparatus of claim 1, wherein the low order polynomial predistortion signal is a third order polynomial according to the following equation:

$$r = x|x|^2 C_2 + x|x|C_1 + xC_0$$

where r represents a predistorted radio frequency signal, x represents the input radio frequency signal, and $C_2$, $C_1$ and $C_0$ represent adjustable complex control coefficients.

5. The apparatus of claim 1, further comprising a controller for adjusting the predistortion signal generated by the predistortion circuitry.

6. The apparatus of claim 1, wherein the intermodulation distortion products are produced by a nonlinear amplifier, and the predistortion signal is applied to the input radio frequency signal prior to amplification in the nonlinear amplifier.

7. The apparatus of claim 6, wherein the controller adjusts the predistortion signal based on a difference between an output of the amplifier and the input radio frequency signal.

8. The apparatus of claim 1, wherein the predistortion circuitry comprises an envelope detector for detecting an envelope of the input radio frequency signal, and wherein the predistortion circuitry generates the predistortion signal based on the detected envelope.

9. The apparatus of claim 8, wherein the predistortion circuitry comprises a variable saturation amplifier for clipping the detected envelope to approximately a hyperbolic tan shape.

10. The apparatus of claim 9, wherein the predistortion circuitry comprises a variable gain amplifier for scaling the clipped envelope.

11. The apparatus of claim 1, wherein said predistortion circuitry comprises:

a predistortion circuit for generating non-zero order terms associated with the low order polynomial predistortion signal; and a controller for generating a zero order term associated with the low order polynomial predistortion signal.

12. A method of compensating for distortion over a wideband, the method comprising the steps of:

receiving an input wideband radio frequency signal;

generating a wideband predistortion signal, which is a low order polynomial; and applying the wideband, low order polynomial predistortion signal to the input wideband radio frequency signal, wherein the wideband, low order polynomial predistortion signal contains terms that compensate for third order and higher order intermodulation distortion products.

13. The method of claim 12, wherein the input radio frequency signal is a multi-tone radio frequency signal.

14. The method of claim 11, wherein the low order polynomial predistortion signal is generated according to the following equation:

$$r = x|x|^2 C_2 + x|x|C_1 + xC_0$$

where r represents a predistorted radio frequency signal, x represents the input radio frequency signal, and $C_1$, $C_2$, and $C_0$ represent adjustable complex control coefficients.

15. The method of claim 12, further comprising a step of adjusting the predistortion signal.

16. The method of claim 12, wherein the intermodulation distortion products are produced by a nonlinear amplifier, and the predistortion signal is applied to the input radio frequency signal prior to amplification by the nonlinear amplifier.

17. The method of claim 16, wherein the predistortion signal is adjusted based on a detected difference between the amplifier output and the input radio frequency signal.

18. The method of claim 12, wherein the step of generating the predistortion signal comprises the steps of:

detecting an envelope of the input radio frequency signal; and generating the predistortion signal based on the detected envelope.

19. The method of claim 18, wherein the step of generating the predistortion signal comprises a step of clipping the detected envelope to approximately a hyperbolic tan shape.

20. The method of claim 19, wherein the step of generating a predistortion signal comprises a step of scaling the detected envelope.

* * * * *